(12) United States Patent
Rhee et al.

(10) Patent No.: US 10,178,472 B1
(45) Date of Patent: Jan. 8, 2019

(54) OMNIDIRECTIONAL ACOUSTIC SENSOR

(71) Applicant: SAMSUNG ELECTRONICS CO., LTD., Suwon-si (KR)

(72) Inventors: Choongho Rhee, Anyang-si (KR); Sungchan Kang, Hwaseong-si (KR); Cheheung Kim, Yongin-si (KR); Sangha Park, Seoul (KR); Yongseop Yoon, Seoul (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/834,287

(22) Filed: Dec. 7, 2017

(30) Foreign Application Priority Data

Aug. 4, 2017 (KR) .................. 10-2017-0099083

(51) Int. Cl.
| | |
|---|---|
| *H04R 1/32* | (2006.01) |
| *H01L 41/113* | (2006.01) |
| *H01L 41/053* | (2006.01) |
| *H04R 1/28* | (2006.01) |
| *H01L 41/083* | (2006.01) |
| *H04R 17/02* | (2006.01) |
| *H04R 7/06* | (2006.01) |
| *H01L 41/18* | (2006.01) |

(52) U.S. Cl.
CPC ........... *H04R 1/326* (2013.01); *H01L 41/053* (2013.01); *H01L 41/083* (2013.01); *H01L 41/1132* (2013.01); *H01L 41/18* (2013.01); *H04R 1/2807* (2013.01); *H04R 7/06* (2013.01); *H04R 17/02* (2013.01)

(58) Field of Classification Search
CPC ...... H04R 1/326; H04R 17/02; H04R 1/2807; H04R 7/06; H01L 41/053; H01L 41/083; H01L 41/1132; H01L 41/18
USPC .......................................................... 381/92
See application file for complete search history.

(56) References Cited

U.S. PATENT DOCUMENTS

| | | |
|---|---|---|
| 8,098,002 B2 | 1/2012 | Baborowski et al. |
| 8,987,976 B2 | 3/2015 | Zuo et al. |
| 2017/0111021 A1 | 4/2017 | McCarron et al. |
| 2018/0038901 A1* | 2/2018 | Kim ...................... G01R 23/16 |

OTHER PUBLICATIONS

U.S. Appl. No. 15/450,416, filed Mar. 6, 2017, Samsung Electronics Co., Ltd.
U.S. Appl. No. 15/492,494, filed Apr. 20, 2017, Samsung Electronics Co., Ltd.

* cited by examiner

*Primary Examiner* — Paul S Kim
(74) *Attorney, Agent, or Firm* — Sughrue Mion, PLLC

(57) ABSTRACT

An omnidirectional acoustic sensor is provided. The omnidirectional acoustic sensor includes first, inner resonators connected to an inner circumference of a supporting frame and second, outer resonators connected to an outer circumference of the supporting frame. The first, inner resonators vibrate in a height direction of the supporting frame and the second, outer resonators vibrate in a lateral direction of the supporting frame.

19 Claims, 7 Drawing Sheets

OMNIDIRECTIONAL ACOUSTIC SENSOR

CROSS-REFERENCE TO RELATED APPLICATION

This application claims the priority from Korean Patent Application No. 10-2017-0099083, filed on Aug. 4, 2017, in the Korean Intellectual Property Office, the disclosure of which is incorporated herein in its entirety by reference.

BACKGROUND

1. Field

Apparatuses consistent with exemplary embodiments relate to omnidirectional acoustic sensors.

2. Description of the Related Art

An acoustic sensor having a resonator array includes a plurality of resonators having different resonance frequencies. Each of the resonators selectively resonates at a specific resonance frequency with respect to a vibration wave, such as a sound wave, outputs an electrical signal by transforming a resonance level thereof, and detects the intensity of every frequency band of the vibration wave.

The frequency of a resonator may depend on the length of the resonator. For example, a resonance frequency of a resonator may be inversely proportional to a square of a length thereof.

A resonator array has directionality because it responds with respect to a sound wave received from a particular direction. In order to configure an acoustic sensor that may respond to sound waves received from any of various directions, a plurality of resonator arrays must be three dimensionally arranged.

SUMMARY

One or more exemplary embodiments provide omnidirectional acoustic sensors configured to detect vibration waves in 3 dimensional directions with a single chip.

Additional exemplary aspects and advantages will be set forth in part in the description which follows and, in part, will be apparent from the description, or may be learned by practice of the presented exemplary embodiments.

According to an aspect of an exemplary embodiment, an omnidirectional acoustic sensor includes a supporting frame, a plurality of inner resonators connected to an inner circumference of the supporting frame, and a plurality of outer resonators connected to an outer circumference of the supporting frame, wherein the inner resonators vibrate in a height direction of the supporting frame, and the outer resonators vibrate in a lateral direction of the supporting frame.

Each inner resonator may include a vibration unit having a plate shape, a first end of which is fixed on the supporting frame, a piezoelectric sensor unit arranged on an upper surface of the vibration unit, and a mass arranged on the piezoelectric sensor unit above a second, free end of the vibration unit.

An upper surface of the supporting frame may be substantially coplanar with the upper surfaces of the vibration units.

The supporting frame may have a square frame shape, the inner circumference of the supporting frame may include opposite first and second inner surfaces, the plurality of vibration units may extend in directions facing each other from the first and the second inner surfaces of the supporting frame, and lengths of plurality of the vibration units on the first inner surface may sequentially increase in a first direction and lengths of plurality of the vibration units on the second inner surface may sequentially decrease in the first direction.

The vibration units may have a plate shape having a width, in the lateral direction of the supporting frame, greater than a height thereof, in the height direction of the supporting frame.

An inner circumference of the supporting frame may be a circle and the lengths of the vibration units may sequentially increase along the inner surface of the supporting frame in a clockwise direction or a counter-clockwise direction.

Each of the outer resonators may include a vibration unit having a plate shape, a first end of which is fixed on the supporting frame; a piezoelectric sensor unit arranged on an upper surface of the vibration unit; and a mass arranged on a side of the vibration unit.

The supporting frame may have a square frame shape, the outer resonators may include a plurality of first outer resonators extending outwards from two opposite surfaces of the supporting frame and a plurality of second outer resonators extending outwards from the other two opposite surfaces of the supporting frame.

The mass of each of the first outer resonators and the second outer resonators may be biased with respect to the vertical axis of the corresponding vibration unit. Lengths of the first outer resonators on the two opposite surfaces of the supporting frame may sequentially increase in different directions from each other, and lengths of the plurality of second outer resonators on the other two opposite surfaces of the supporting frame may sequentially increase in different directions from each other.

In each of the first outer resonators and the second outer resonators, the mass arranged on an the outer circumference of the supporting frame may be exposed viewed from a direction parallel to the outer circumference of the supporting frame.

The piezoelectric sensor units of the inner resonators may include first piezoelectric layers that generate an electrical signal in response to a displacement of the corresponding vibration units, and the piezoelectric sensor units of the outer resonators may include second piezoelectric layers that generate an electrical signal in response to a displacement of the corresponding vibration units, wherein the first and second piezoelectric layers may include AlN or ZnO.

The first piezoelectric layers may include a c-axis direction piezoelectric material and the second piezoelectric layers may include a tilted c-axis direction material.

The masses of the inner resonators may include silicon, and the masses of the outer resonators may include a metal material.

The omnidirectional acoustic sensor may further include a protection member surrounding the supporting member.

The protection member may include inlets for a sound to travel toward the outer resonators and outlets for a sound to be travel away from the outer resonators.

The omnidirectional acoustic sensor may further include a connection member connecting a lower portion of the protection member and a lower portion of the supporting frame.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
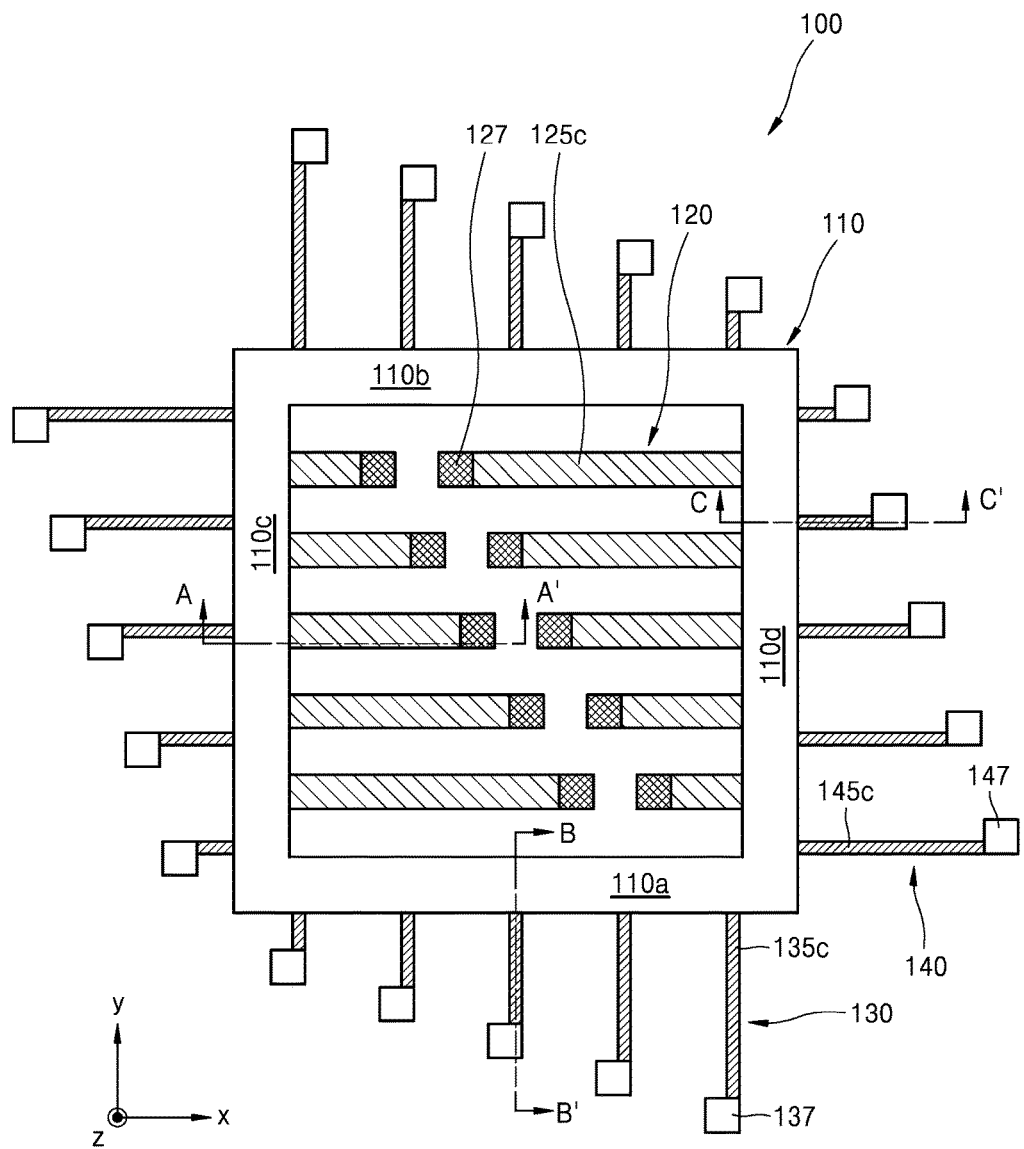
FIG. 1 is a plan view of a structure of an omnidirectional acoustic sensor according to an exemplary embodiment.

Reference will now be made in detail to exemplary embodiments which are illustrated in the accompanying drawings. In the drawings, thicknesses of layers and regions may be exaggerated for clarity of layers and regions. The embodiments are capable of various modifications and may be embodied in many different forms.

Hereinafter, when an element or layer is referred to as being "on" or "above" another element or layer, the element or layer may be directly on another element or layer or intervening elements or layers.

Figure 2:
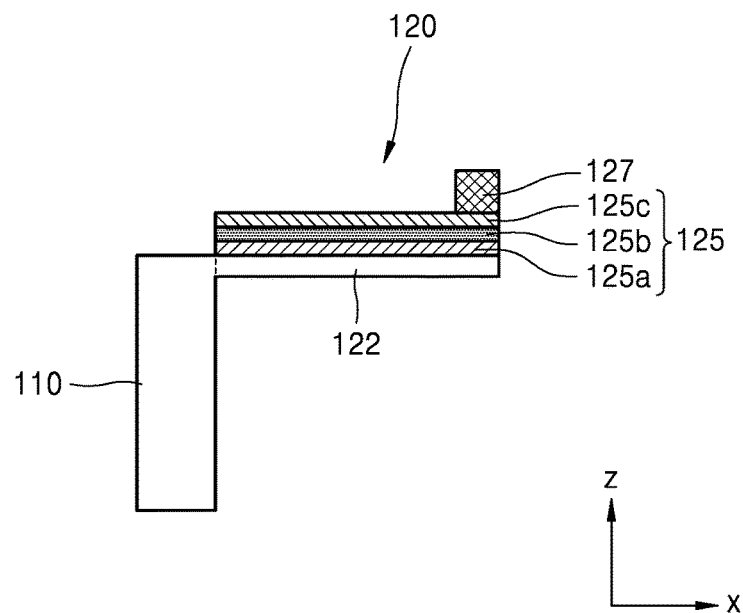
FIG. 2 is a cross-sectional view of line A-A' of FIG. 1.
Figure 3:
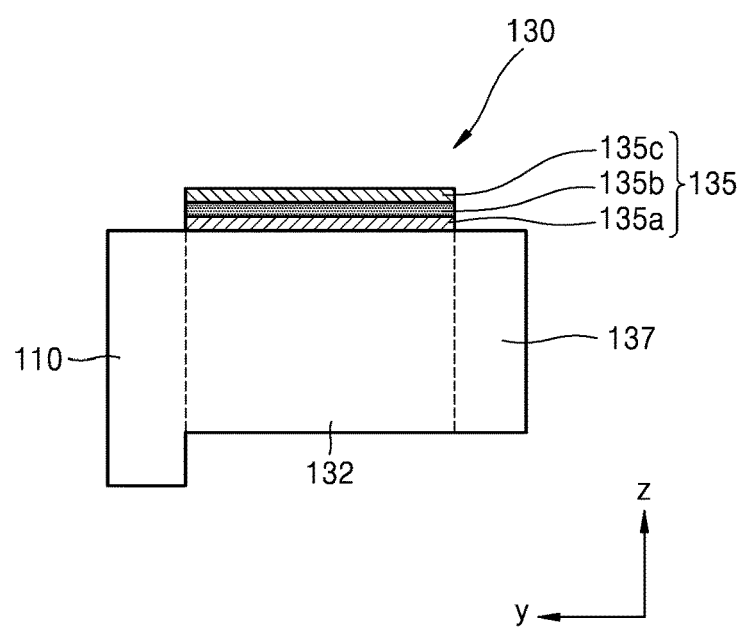
FIG. 3 is a cross-sectional view of line B-B' of FIG. 1.
Figure 4:
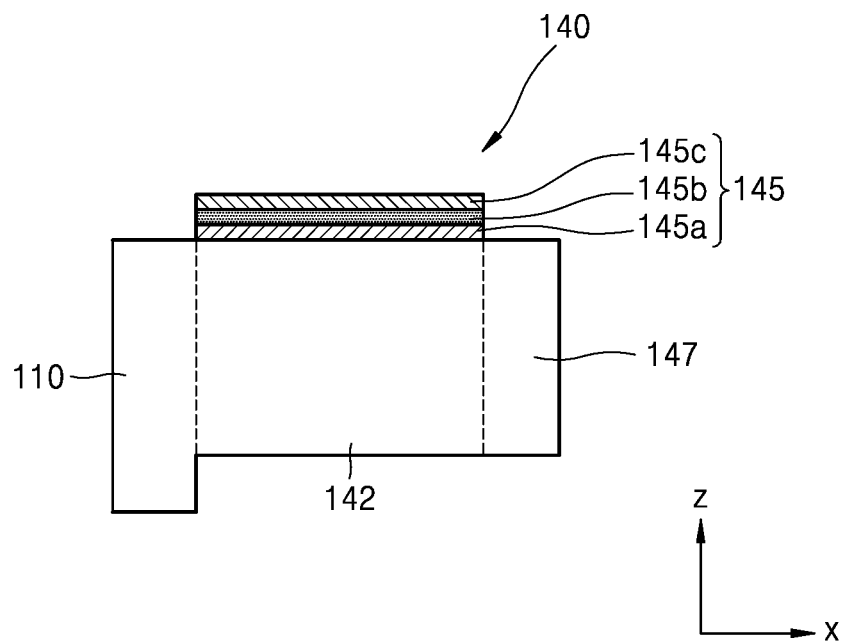
FIG. 4 is a cross-sectional view of line C-C' of FIG. 1.

FIG. 1 is a plan view of a structure of an omnidirectional acoustic sensor 100 according to an exemplary embodiment. FIG. 2 is a cross-sectional view of line A-A' of FIG. 1. FIG. 3 is a cross-sectional view of line B-B' of FIG. 1. FIG. 4 is a cross-sectional view of line C-C' of FIG. 1.

Referring to FIG. 1, the omnidirectional acoustic sensor 100 includes a resonator array arranged on a supporting member 110 having a shape of a square outline. In other words, the supporting member 110 has a square frame shape. However, the shape is not limited thereto, and the supporting member may be a frame having another shape, such as, for example, another polygon or a circle. The resonator array includes a plurality of first resonators 120 that vibrate in a vertical direction (a z direction), a plurality of second resonators 130 that vibrate in an x direction, and a plurality of third resonators 140 that vibrate in a y direction. The second resonators 130 and the third resonators 140 may have similar structures. The first through third resonators 120, 130, and 140 may be cantilever-type resonators and may be fixed to sides of the supporting member 110. The omnidirectional acoustic sensor 100 may selectively provide an acoustic signal having a desired frequency with respect to a sound signal received from a direction.

Referring to FIGS. 1 and 2, the first resonators 120 include vibration units 122 extending toward each other from opposite inner surfaces of the supporting member 110 (i.e. opposite sides of the inner circumference of the frame shape of the supporting member 110). The supporting member 110 and the vibration units 122 may be formed of a single, unitary body. Upper surfaces of the vibration units 122 may be coplanar with an upper surface of the supporting member 110.

The vibration units 122 may be of a plate type. For example, a width thereof (for example, extending in the y-direction) is greater than a height thereof (for example, extending in the z-direction). The vibration units 122 may have a thickness (height) of approximately 1 μm or less. The vibration units 122 may have a width in a range from about a few μm to a few hundreds of μm. The vibration units 122 may have the same widths and heights, but may have different lengths. The vibration units 122 may have a length (in the x-direction, for example) of about a few hundreds of μm or less. The vibration units 122 may be manufactured by using a micro electro mechanical system (MEMS) process.

The vibration units 122 and the supporting member 110 may be manufactured as one body including silicon generally used in a semiconductor process, but the present embodiment is not limited thereto. The vibration units 122 may include glass, silicon oxide, or silicon nitride, and the vibration units 122 may be formed of a material different from that of the supporting member. The resonance characteristics of the first resonators 120 may depend on the sizes of the vibration units 122 and of the masses 127, which will be described below.

Piezoelectric sensor units 125 may be arranged on upper surfaces of the vibration units 122. The masses 127 may be arranged on the free ends of the vibration units 122 on the piezoelectric sensor units 125.

In the present exemplary embodiment, the masses 127 are arranged on the piezoelectric sensor units 125, but the present embodiment is not limited thereto. For example, the piezoelectric sensor units 125 may be arranged on the upper surfaces of the fixed ends of the vibration units 122, and the masses 127 may be separately arranged on the upper surfaces of the free ends of the vibration units 122, apart from the piezoelectric sensor units 125.

Each piezoelectric sensor unit 125 may include a lower electrode 125a, a piezoelectric layer 125b, and an upper electrode 125c, sequentially arranged on the vibration unit 122 in the stated order. Each of the lower electrode 125a, the piezoelectric layer 125b, and the upper electrode 125c may have a thicknesses in a range from about 0.1 μm to about 0.3 μm.

The piezoelectric layer 125b may include ZnO, PZT, ZnSnO3, Polyvinylidene fluoride (PVDF), poly(vinylidene fluoride-trifluoroethylene) (P(VDF-TrFE)), AlN, or PMN-PT. The piezoelectric layer 125b may be a crystal of c-axis oriented AlN or ZnO, and the piezoelectric layer 125b having the crystal may have a high sensitivity with respect to a vibration in the z-axis direction.

The lower electrode 125a and the upper electrode 125c may each include a metal material or other conductive material. For example, the lower electrode 125a and the upper electrode 125c may include molybdenum, platinum, aluminum, copper, or titanium.

In a dynamic behavior of the cantilever structure, the masses 127 may increase the inertial force of the vibration units 132 when an external force, such as a sound or other vibration, is applied to the vibration units 132. The mass 127 may include a metal, such as steel or tungsten.

The first resonators 120 may have a structure similar to each other, but may, alternately, have sizes different from each other. For example, the vibration units 122 may have different lengths. When the lengths of the vibration units 122 are different, the first resonators 120 may have resonance frequencies different from each other. The resonance frequencies of the first resonators 120 are related to the maximum displacement of the corresponding first resonators 120. The resonance frequency of a first resonator 120 is inversely proportional to a square of the length of the first resonator 120, so as the lengths of the vibration units 122 of the first resonators 120 increase, the resonance frequencies decrease. Also, the resonance frequency may be controlled by varying the sizes of the mass 127.

The first resonators 120 may be arranged not to overlap with each other when viewed from a plan view. That is, the first resonators 120 may be arranged so that all the first resonators 120 are simultaneously exposed with respect to a sound received from the z direction, as shown in FIG. 1. Gaps between the adjacent first resonators 120 may be approximately a few μm. In FIG. 1, the omnidirectional acoustic sensor 100 includes ten first resonators 120, but this is merely exemplary. Alternately, for example, the omnidirectional acoustic sensor 100 may include 30 to 100 first resonators 120. The first resonators 120 may have resonance frequencies in a range from about 200 Hz to about 20 kHz. In order to arrange the plurality of first resonators 120 in a single space, after arranging the first resonators 120 in the order of sequentially increasing the length thereof, odd numbered first resonators 120 are sequentially arranged on an inner surface of the supporting member 110 in the order of increasing the length in a −y direction, and even numbered first resonators 120 are sequentially arranged on the opposite inner surface of the supporting member 110 facing each other in the order of decreasing the length in the −y direction.

The first resonators 120 vibrate in the z direction in response to an external signal, and a displacement value z may be determined according to the following Motion Equation.

$$m\frac{d^2z}{dt^2} + c\frac{dz}{dt} + kz = F_0 \cos \omega t$$

Here, m is a mass of the mass 127, c is a damping coefficient, k is an elastic coefficient, and $F_0 \cos \omega t$ is a driving force. The k value is determined by a physical property and shape of the vibration unit 122.

The first resonator 120 may show a frequency response characteristic having a resonance frequency of $f_0$ according to the Motion Equation.

The resonance frequency $f_0$ may be determined by the following equation.

$$f_0 = \frac{1}{2\pi}\sqrt{\frac{k}{m}}$$

In this way, the first resonators 120 may have designed resonance frequencies different from each other, and, respectively, may detect predetermined frequency bands with the resonance frequencies as center frequencies.

Referring to FIGS. 1 and 3, the second resonators 130 include vibration units 132 extending outwards from an external surface of the supporting member 110 (i.e. an outer circumference of the frame shape of the supporting member 110). Upper surfaces of the vibration units 132 may be coplanar with the upper surface of the supporting member 110.

The vibration units 132 may be of a plate type. For example, a height thereof is greater than a width thereof. The vibration units 132 may have a width (extending for example in the x-direction) of approximately 1 μm or less, and may have a height (for example, extending in the z-direction) in a range from about a few μm to a few tens of μm. The vibration units 132 and the supporting member 110 may include silicon generally used in a semiconductor process. But the present embodiment is not limited thereto. The vibration units 132 may include glass, silicon oxide, or silicon nitride. The vibration units 132 and the supporting member 110 may be formed as one body. The resonance characteristics of the second resonators 130 may depend on the sizes of the vibration units 132 and of the masses 137 which will be described below.

Piezoelectric sensor units 135 are arranged on upper surfaces of the vibration units 132. The masses 137 may be arranged on the free ends of the vibration units 132. The upper surfaces of the vibration unit 132 may be coplanar with upper surfaces of the masses 137. The masses 137 and the vibration units 132 may be formed of the same material. For example, the masses 137 may include silicon. The masses 137 may have a width greater than that of the vibration units 132. In a dynamic behavior of the cantilever structure, the masses 137 may increase the inertial force of the vibration units 132 when an external force, such as a sound or another vibration, is applied to the vibration units 132.

In FIG. 3, it is depicted as that the piezoelectric sensor unit 135 covers an entire upper surface of the vibration unit 132, but the present embodiment is not limited thereto. For example, alternately, the piezoelectric sensor unit 135 may cover only a portion of the vibration unit 132 on the fixed end side thereof.

The piezoelectric sensor unit 135 may include a lower electrode 135a, a piezoelectric layer 135b, and an upper electrode 135c sequentially arranged on the vibration unit 132 in the stated order. The lower electrode 135a, the piezoelectric layer 135b, and the upper electrode 135c, respectively, may have thicknesses in a range from about 0.1 μm to about 0.3 μm.

The piezoelectric layer 135b may include ZnO, PZT, ZnSnO$_3$, PVDF, P(VDF-TrFE), AlN, or PMN-PT. The piezoelectric layer 135b may be a crystal of tilted c-axis oriented AlN or ZnO, and the piezoelectric layer 135b having the crystal may have a high sensitivity with respect to a vibration in a x-axis direction or a y-axis direction. The tilted angle of the piezoelectric sensor unit 135b may be in a range from about 20 degrees to about 40 degrees.

As depicted in FIG. 1, the masses 137 may be arranged to be biased toward a side of the vibration units 132 with respect to a vertical axis of the vibration units 132. The shape of the vibration units 132 may allow a greater number of masses 137 of the vibration units 132 to be formed in a narrow region without overlapping each other.

The second resonators 130 may have similar structures, but may have different sizes from each other. For example, the vibration units 132 may have different lengths from each other. The second resonators 130 may have different resonance frequencies from each other. A resonance frequency of each of the second resonators 130 may be related to the maximum x-axis displacement. As the lengths of the vibration units 132 of the second resonators 130 increase, the resonance frequencies thereof may decrease.

The second resonators 130 may be arranged so that all the masses 137 are simultaneously exposed with respect to a physical force received from an x direction. For example, all of the masses 137 of the second resonators 130 attached to a first region 110a of the supporting member 110 may be exposed with respect to air entering from a +x direction. All of the masses 137 of the second resonators 130 arranged on a second region 110b of the supporting member 110 may be exposed with respect to air entering from a −x direction. That is, the second resonators 130 arranged on the first and second regions 110a and 110b have lengths that sequentially vary, and the directions of increasing lengths of the second resonators 130 may be opposite to each other in the first and second regions 110a and 110b of the supporting member 110.

The second resonators 130 may be manufactured by using a MEMS process.

The second resonators 130 vibrate in an x-axis direction in response to an external signal. The displacement principle of the second resonators 130 is similar to that of the first resonators 120, and thus, detailed descriptions thereof will be omitted.

Referring to FIGS. 1 and 4, the third resonators 140 include vibration units 142 extending outwards from an external surface of the supporting member 110. An upper surface of the vibration unit 142 may be coplanar with an upper surface of the supporting member 110.

The vibration units 142 may have a plate shape. For example, a height thereof (extending in the z-direction, for example) is greater than a width thereof (extending in the y-direction, for example). The vibration units 142 may have a width of 1 μm or less. Also, the height of the vibration units 142 may be in a range from about a few μm to about a few tens of μm. The vibration units 142 and the supporting member 110 may be formed of silicon generally used in a semiconductor process. But the present embodiment is not limited thereto. The vibration units 132 may be formed of glass, silicon oxide, or silicon nitride. The vibration units 142 and the supporting member 110 may be manufactured as one body. The resonance characteristics of the third resonators 140 may depend on the sizes of the vibration units 142 and of the masses 147 which will be described below.

Piezoelectric sensor units 145 may be arranged on the upper surfaces of the vibration units 142. The masses 147 may be arranged on sides of the free ends of the vibration units 142. The upper surfaces of the vibration units 142 may be coplanar with upper surfaces of the masses 147. The masses 147 and the vibration units 142 may be formed of the same material. For example, the masses 147 may include silicon. The masses 147 may have a width greater than a width of the vibration units 142. For example, the masses 147 may have a width in a range from about a few μm to about a few tens of μm. In a dynamic behavior of the cantilever structure, the masses 147 may increase an inertial force of the vibration units 142 when an external force, such as a sound or another vibration, is applied to the vibration units 142.

In FIG. 4, it is depicted that the piezoelectric sensor unit 145 covers an entire upper surface of the vibration unit 142, but the present embodiment is not limited thereto. For example, alternately, the piezoelectric sensor unit 145 may be formed on the fixed end of the vibration unit 142.

The piezoelectric sensor unit 145 may include a lower electrode 145a, the piezoelectric layer 145b, and the upper electrode 145c sequentially arranged on the vibration unit 142 in the stated order. The lower electrode 145a, the piezoelectric layer 145b, and the upper electrode 145c, respectively, may have a thickness in a range from about 0.1 μm to about 0.3 μm.

The piezoelectric layer 145b may include ZnO, PZT, ZnSnO3, PVDF, P(VDF-TrFE), AlN, or PMN-PT. The piezoelectric layer 145b may be tilted c-axis ALN or ZnO. The tilted angle of the piezoelectric layer 145b may be in a range from about 20 degrees to about 40 degrees.

As depicted in FIG. 1, the masses 147 may be arranged to be biased toward a side of the vibration units 142 with respect to a vertical axis of the vibration units 142. The shape of the vibration units 142 may allow a greater number of masses 147 of the vibration units 142 to be formed in a narrow region without overlapping each other.

The third resonators 140 may have similar structures, but may have different sizes from each other. For example, the vibration units 142 may have different lengths from each other. The third resonators 140 may have different resonance frequencies from each other. A resonance frequency of each of the third resonators 140 may be related to the maximum y-axis displacement. As the lengths of the vibration units 142 of the third resonators 140 increase, the resonance frequencies thereof may decrease.

The third resonators 140 may be arranged so that all the masses 147 are simultaneously exposed with respect to a physical force received from a y direction. For example, all of the masses 147 of the third resonators 140 attached to a third region 110c of the supporting member 110 may be exposed with respect to air entering from a +y direction. All of the masses 147 of the third resonators 140 arranged on a fourth region 110d of the supporting member 110 may be exposed with respect to air entering from a −y direction. That is, the third resonators 140 arranged on the third and fourth regions 110c and 110d have lengths that sequentially vary, and the directions of increasing lengths of the third resonators 140 may be opposite to each other in the third and fourth regions 110c and 110d of the supporting member 110. The third resonators 140 may be manufactured by using a MEMS process.

The third resonators 140 vibrate in a y-axis direction in response to an external signal, and the displacement principle of the third resonators 140 is similar to that of the first resonators 120, and thus, detailed description thereof will be omitted.

The omnidirectional acoustic sensor 100, according to exemplary embodiments, may sense an acoustic sound in three-axis directions with a single chip. As compared to a case in which three acoustic sensors respectively are installed in three-axis directions, the area required for installing the acoustic sensor may be reduced, and also, the number of acoustic sensors may be reduced.

Figure 5:
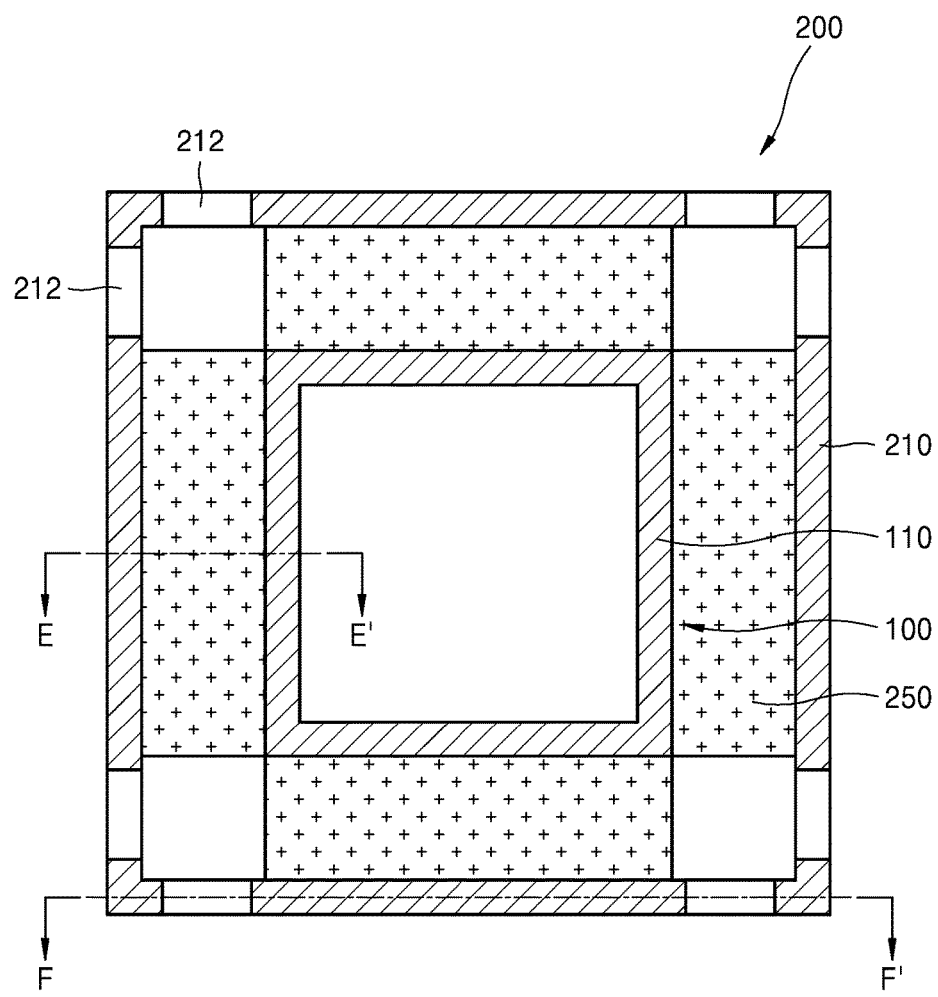
FIG. 5 is a plan view of a structure of an omnidirectional acoustic sensor according to another exemplary embodiment.
Figure 6:
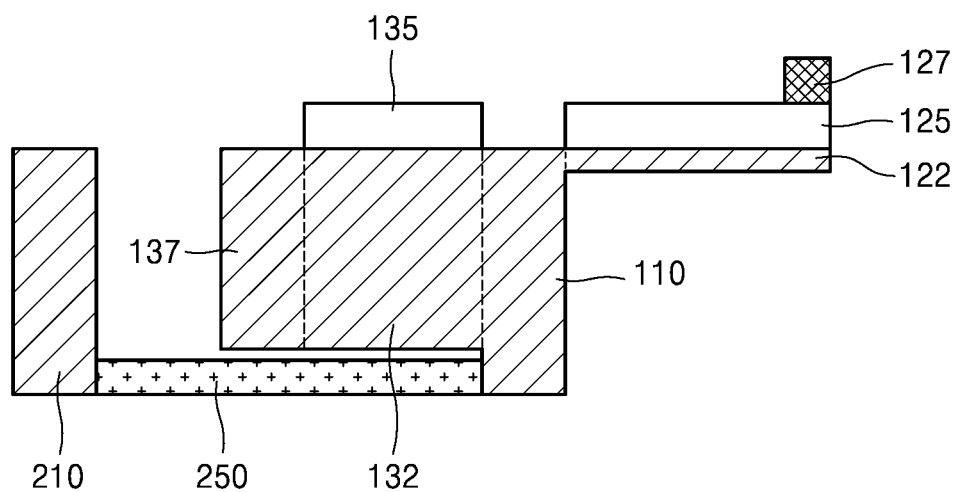
FIG. 6 is a cross-sectional view of line E-E' of FIG. 5.
Figure 7:
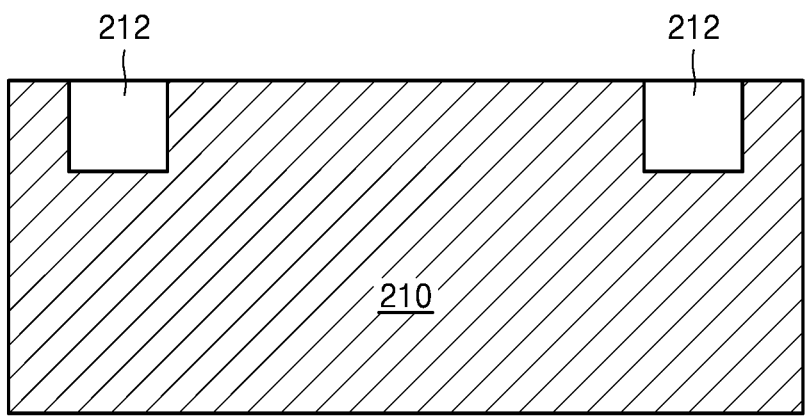
FIG. 7 is a cross-sectional view of line F-F' of FIG. 5.

FIG. 5 is a plan view of a structure of an omnidirectional acoustic sensor 200 according to another exemplary embodiment. In FIG. 5, partial configurations of resonators are omitted for convenience. FIG. 6 is a cross-sectional view of line E-E' of FIG. 5. FIG. 7 is a cross-sectional view of line F-F' of FIG. 5. Like reference numerals are used to indicate elements that are substantially identical to the elements described above, and thus, the detailed descriptions thereof will not be repeated.

Referring to FIG. 5, the omnidirectional acoustic sensor 200 further includes a protection member 210 that surrounds the omnidirectional acoustic sensor 100 of FIG. 1. The protection member 210 is in a shape of a square outline. The protection member 210 may be formed of the same material as the supporting member 110. The protection member 210 may be formed as one body with the supporting member 110.

FIG. 6 shows a connection structure disposed between the supporting member 110 and the protection member 210. A lower part of the supporting member 110 may be connected to a lower part of the protection member 210 by a connection member 250. The connection member 250 may be formed as one body with the protection member 210. The connection member 250 is separated from the vibration unit 132 and the mass 137 by a predetermined distance, and accordingly, the vibration unit 132 and the mass 137 may vibrate above the connection member 250.

Referring to FIGS. 5 and 7, openings 212 for exposing corresponding masses 137 and 147 are formed in the sides of the protection member 210. The openings 212 may act as inlets or outlets of a physical force, such as a sound, for corresponding masses 137 and 147.

A sound entering from a +z direction causes a vibration of the mass 127 on the supporting member 110, and afterwards, is outputted to the outside. For this purpose, other openings (not shown) may be additionally formed in lower parts of sides of the supporting member 110 and the protection member 210.

According to this exemplary embodiment, the omnidirectional acoustic sensor 200 includes a protection member 210, and thus, the omnidirectional acoustic sensor 200 may be installed in any of various positions and may be thereby protected from damage.

Figure 8:
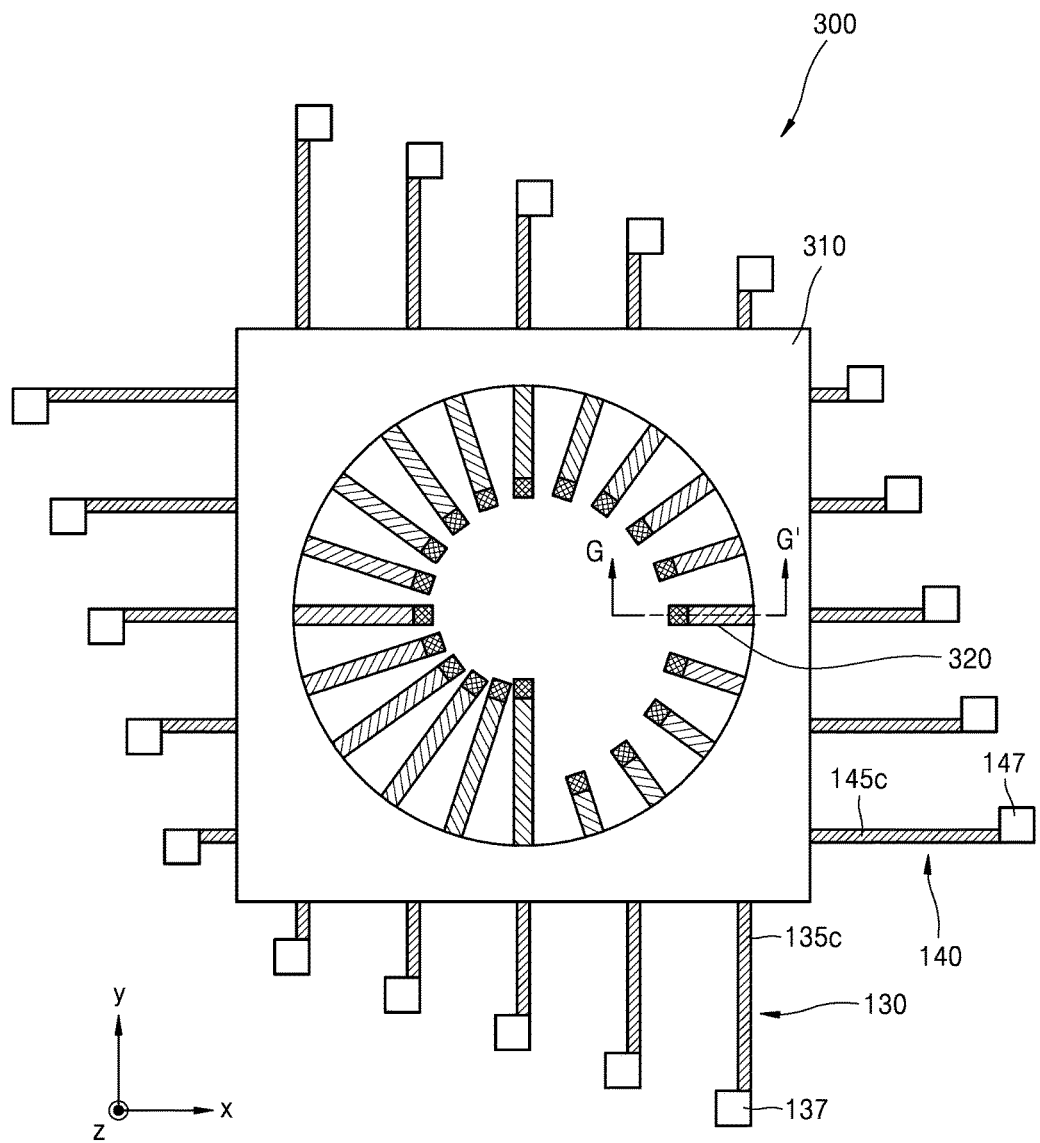
FIG. 8 is a plan view of a structure of an omnidirectional acoustic sensor according to another exemplary embodiment.
Figure 9:
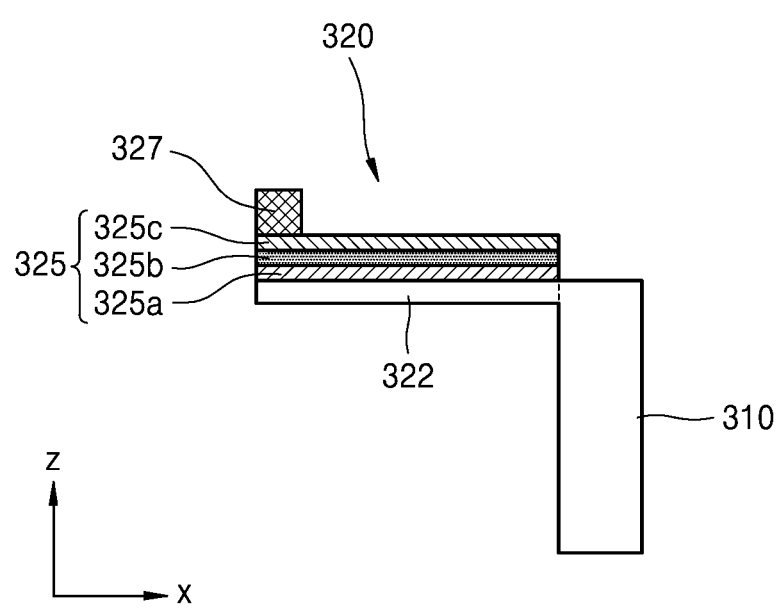
FIG. 9 is a cross-sectional view of line G-G' of FIG. 8.

FIG. 8 is a plan view of a structure of an omnidirectional acoustic sensor 300 according to another exemplary embodiment. FIG. 9 is a cross-sectional view of line G-G' of FIG. 8. Like reference numerals are used to indicate elements that are substantially identical to the elements described above, and thus, the detailed descriptions thereof will not be repeated.

The omnidirectional acoustic sensor 300 of FIG. 8 includes a supporting member 310 having a shape different from that of the supporting member 110 of FIG. 1, and an arrangement of first resonators 320 is different from that of the first resonators 120 of FIG. 1.

Referring to FIGS. 8 and 9, vibration units 322 of the first resonators 320 extend toward the center of the supporting member 310 from an inner circumference of the supporting member 310. Upper surfaces of the vibration units 322 may be coplanar with an upper surface of the supporting member 310.

Piezoelectric sensor units 325 may be arranged on the upper surfaces of the vibration units 322. Masses 327 may be arranged on the piezoelectric sensor units 325 to be above free edges of the vibration units 322.

In the omnidirectional acoustic sensor 300 according to this exemplary embodiment, the masses 327 are arranged on the piezoelectric sensor units 325, but the present exemplary embodiment is not limited thereto. For example, the piezoelectric sensor units 325 may be arranged on the upper surfaces of the fixed ends of the vibration units 322, and the masses 327 may be arranged directly on the upper surfaces of the free ends of the vibration units 322, separate from the piezoelectric sensor units 325.

Each of the piezoelectric sensor units 325 may include a lower electrode 325*a*, the piezoelectric layer 325*b*, and an upper electrode 325*c*, sequentially arranged on the vibration unit 322 in the stated order. The lower electrode 325*a*, the piezoelectric layer 325*b*, and the upper electrode 325*c* may have thicknesses in a range from about 0.1 μm to about 0.3 μm.

The piezoelectric layer 325*b* may include ZnO, PZT, $ZnSnO_3$, PVDF, P(VDF-TrFE), AlN, or PMN-PT. The piezoelectric layer 325*b* may be a crystal of c-axis oriented AlN or ZnO.

The lower electrode 325*a* and the upper electrode 325*c* may each include a metal material or other conductive material. For example, the lower electrode 325*a* and the upper electrode 325*c* may include molybdenum, platinum, aluminum, copper, or titanium.

According to the dynamic behavior of the cantilever structure, the masses 327 may increase the inertial force of the vibration units 322 when an external force, such as a sound or another vibration, is applied to the vibration units 322. The mass 327 may include a metal, such as steel or tungsten.

The first resonators 320 may have a structure similar to each other, but may have different sizes. For example, the vibration units 322 may have different lengths. When the lengths of the vibration units 322 are different, the first resonators 320 may have resonance frequencies different from each other. The resonance frequencies of the first resonators 320 are related to the maximum displacement of the corresponding first resonators 320. The resonance frequency of a first resonator 320 is inversely proportional to a square of a length of the resonator 320, so as the lengths of the vibration units 322 of the first resonators 320 increase, the resonance frequencies decrease.

Structures of the second resonators 130 and the third resonators 140 may be understood well from the exemplary embodiments described above, and thus, the detailed descriptions thereof will not be repeated.

Additionally, the protection member 210 of FIG. 6 may also be arranged around the omnidirectional acoustic sensor 300, and an additional detailed description of the structure will be omitted.

The omnidirectional acoustic sensor 300 according to exemplary embodiments may readily control resonance frequencies between the first resonators 320 by sequentially arranging the first resonators 320, which are sensors sensing vibrations in the z-axis, on an inner surface of the supporting member 310.

In the omnidirectional acoustic sensor according to an exemplary embodiment, a single chip may sense sounds in 3-axis directions. Therefore, as compared to a system in which three acoustic sensors, respectively, are arranged in three directions, the total area required for arranging acoustic sensors may be reduced, and also, the number of acoustic sensors may be reduced.

While one or more exemplary embodiments have been described with reference to the figures, it will be understood by those of ordinary skill in the art that various changes in form and details may be made therein without departing from the spirit and scope as defined by the following claims.

What is claimed is:

1. An omnidirectional acoustic sensor comprising:
   a supporting frame;
   a plurality of inner resonators connected to an inner circumference of the supporting frame;
   wherein each of the plurality of inner resonators comprises:
   a vibration unit having a plate shape, wherein a first end of the vibration unit is fixed to the inner circumference of the supporting frame;
   a piezoelectric sensor unit arranged on an upper surface of the vibration unit; and
   a mass arranged on the piezoelectric sensor unit above a second end of the vibration unit, opposite the first end; and
   a plurality of outer resonators connected to an outer circumference of the supporting frame,
   wherein the plurality of inner resonators vibrate in a height direction of the supporting frame, and the plurality of outer resonators vibrate in a lateral direction of the supporting frame, perpendicular to the height direction.

2. The omnidirectional acoustic sensor of claim 1, wherein the upper surface of the vibration unit is substantially coplanar with an upper surface of the supporting frame.

3. The omnidirectional acoustic sensor of claim 1, wherein:
the supporting frame has a square frame shape, the inner circumference of the supporting frame comprises a first inner surface and a second inner surface, opposite the first inner surface,
the plurality of inner resonators comprises first inner resonators connected to the first inner surface and second inner resonators connected to the second inner surface;
the vibration unit of each of the first inner resonators extends from the first inner surface toward the second inner surface and the vibration unit of each of the second inner resonators extends from the second inner surface toward the first inner surface, and
the first inner resonators are arranged such that lengths of the first inner resonators sequentially increase in a first direction and the second inner resonators are arranged such that lengths of the second inner resonators sequentially decrease in the first direction.

4. The omnidirectional acoustic sensor of claim 1, wherein a width of the vibration unit, in the lateral direction of the supporting frame, is greater than a height of the vibration unit, in the height direction of the supporting frame.

5. The omnidirectional acoustic sensor of claim 1, wherein the inner circumference of the supporting frame is a circle and lengths of the plurality of inner resonators sequentially increase along the inner circumference of the supporting frame in one of a clockwise direction and a counter-clockwise direction.

6. The omnidirectional acoustic sensor of claim 1, wherein each of the plurality of outer resonators comprises:
a vibration unit having a plate shape, wherein a first end of the vibration unit is fixed to the supporting frame;
a piezoelectric sensor unit arranged on an upper surface of the vibration unit; and
a mass arranged on a side of the vibration unit.

7. The omnidirectional acoustic sensor of claim 6, wherein the upper surface of the vibration unit is substantially coplanar with the upper surface of the supporting frame.

8. The omnidirectional acoustic sensor of claim 6, wherein the mass, the vibration unit and the supporting frame are formed as one, unitary body.

9. The omnidirectional acoustic sensor of claim 6, wherein:
the supporting frame has a square frame shape, the outer circumference of the supporting frame comprises a first pair of opposite outer surfaces and a second pair of opposite outer surfaces,
the plurality of outer resonators comprise first outer resonators connected to the first pair of opposite outer surfaces and second outer resonators connected to the second pair of opposite outer surfaces.

10. The omnidirectional acoustic sensor of claim 9, wherein the mass of each of the plurality of outer resonators is biased with respect to an axis of the vibration unit of the corresponding outer resonator.

11. The omnidirectional acoustic sensor of claim 9, wherein
the first outer resonators are arranged such that lengths of the first outer resonators on the first pair of opposite outer surfaces of the supporting member sequentially increase in different directions from each other, and
the second outer resonators are arranged such that lengths of the second outer resonators on the second pair of opposite outer surfaces of the supporting member sequentially increase in different directions from each other.

12. The omnidirectional acoustic sensor of claim 9, wherein the mass of each of the plurality of outer resonators is exposed when viewed from a direction parallel to the outer surface of the supporting frame from which the corresponding resonator extends.

13. The omnidirectional acoustic sensor of claim 6, wherein a height of the vibration unit, in the height direction of the supporting frame, is greater than a width of the vibration unit, in the lateral direction of the supporting frame.

14. The omnidirectional acoustic sensor of claim 9, wherein, in each of the plurality of inner resonators, the piezoelectric sensor unit comprises first piezoelectric layer that generates an electrical signal in response to a displacement of the vibration unit, and in each of the plurality of outer resonators, the piezoelectric sensor unit comprises a second piezoelectric layer that generates an electrical signal in response to a displacement of the vibration unit,
wherein the first piezoelectric layer and the second piezoelectric layer comprise one of AN and ZnO.

15. The omnidirectional acoustic sensor of claim 14, wherein the first piezoelectric layer comprises a c-axis direction piezoelectric material and the second piezoelectric layer comprises a tilted c-axis direction material.

16. The omnidirectional acoustic sensor of claim 9, wherein, in each of the plurality of inner resonators, the mass comprises silicon, and in each of the plurality of outer resonators, the mass comprises a metal material.

17. The omnidirectional acoustic sensor of claim 1, further comprising a protection member surrounding the supporting frame.

18. The omnidirectional acoustic sensor of claim 17, wherein the protection member comprises inlets for sound to travel toward the plurality of outer resonators and outlets for sound to travel away from the plurality of outer resonators.

19. The omnidirectional acoustic sensor of claim 17, further comprising a connection member that connects to a lower portion of the protection member and a lower portion of the supporting member.

* * * * *